United States Patent [19]

Stone

[11] 4,015,315

[45] Apr. 5, 1977

[54] METHOD OF SETTING CATHODE-G1 SPACING

[75] Inventor: Robert Porter Stone, Lancaster, Pa.

[73] Assignee: RCA Corporation, New York, N.Y.

[22] Filed: July 14, 1975

[21] Appl. No.: 595,808

[52] U.S. Cl. .............................................. 29/25.16
[51] Int. Cl.[2] ........................................... H01J 9/18
[58] Field of Search ........... 29/25.13, 25.15, 25.16, 29/593

[56] References Cited

UNITED STATES PATENTS 3,643,299 2/1972 Brown ............................ 29/25.16

*Primary Examiner*—Richard B. Lazarus
*Attorney, Agent, or Firm*—Glenn H. Bruestle; William H. Murray

[57] ABSTRACT

In an electron gun assembly comprising at least one oxide coated cathode and a G1 grid, a method of spacing the cathode a predetermined distance from the G1 grid includes the following steps. First, the cathode oxide coating is moistened with water causing it to become electrically conductive. Next an ohmmeter is connected to indicate the electrical resistance between the electrically conductive oxide coating and the G1 grid. The spacing between the cathode and the G1 grid is then reduced until the ohmmeter indicates that there is electrical conductivity therebetween. At this point there is zero spacing between the cathode and the G1 grid. The spacing between the cathode and the G1 grid is then increased by an amount equal to the predetermined spacing. The cathode is then permanently fixed at the predetermined spacing with respect to the G1 grid.

4 Claims, 2 Drawing Figures

METHOD OF SETTING CATHODE-G1 SPACING

BACKGROUND OF THE INVENTION

This invention relates to a method of assembling electron guns for cathode ray tubes and particularly to a method of setting the cathode to G1 grid spacing.

Electron gun assemblies for cathode ray tubes of the type used with television receivers comprise one or more electron guns each of which comprises a plurality of spaced-apart, axially aligned grid electrodes and a cathode. The cathode has electron emissive material on a surface thereof for providing a beam of electrons and the grid electrodes, usually designated G1, G2, etc., perform the functions of controlling, forming, focusing and accelerating the beam. The various electrodes are typically maintained in position by radially disposed lugs which project therefrom and are fused into glass insulating rods.

The cathode to G1 grid spacing is a critical one in that it determines the cut-off voltage of the tube. It is necessary, therefore, to the scheme of mass production and interchangeability of these tubes, that close tolerances be maintained in regard to this spacing and the resultant cut-off voltage dependent thereon.

There are several methods of controlling this spacing currently in use. One of these prior methods utilizes a cup-shaped control grid which has mounted therein a cathode assembly. This assembly usually comprises a substantially cylindrical cathode sleeve, closed at one end, which is mounted in a ceramic disc. The closed end of a cathode sleeve has thereon an emissive material and it is located at a known distance from an end surface of the disc. A cylindrical spacer is affixed to the inside of the control grid and the cathode assembly is positioned within the grid so that the spacer abuts the ceramic disc. A retainer ring is usually positioned against the opposite surface of the ceramic disc and welded to the control grid. In actual use, spacing tolerances are difficult to maintain with this method. The number of pieces involved and the number of placement operations allows a buildup of error that frequently results in a rejected tube.

Another method employs an air comparator and utilizes a ceramic disc having a cathode receiving eyelet affixed thereto. The disc and eyelet are positioned in the control grid and mounted therein by any suitable means. The air comparator is then coupled to the closed end of the grid cup by suitable means, such as an O-ring seal, and a quantity of air is forced through the beam aperture therein. A cathode sleeve is inserted into the eyelet and advanced toward the closed end of the grid cup until the air flow between the grid and cathode reaches a given level, as indicated by a pressure meter, which indicates a desired spacing. Thereupon, the cathode is welded to the eyelet. There are several disadvantages to this method. It is time consuming and therefore expensive and it necessitates the cathode being assembled within the control grid before the gun is assembled, a requirement that is often desirable to avoid.

A third method utilized is one similar to that described above but instead of measuring air flow, the capacitance between the screen or G2 grid and the cathode is measured. This method required expensive and delicate measuring apparatus and expensive shielding since the cathode to screen grid capacitance is of the order of a few femto ($10^{-15}$) farads. All of these prior art methods are fairly complex and time consuming and require relatively sophisticated and expensive equipment.

SUMMARY OF THE INVENTION

A method of spacing an oxide cathode a predetermined distance from a grid electrode in a cathode ray tube electron gun assembly comprises the following steps. First the oxide cathode is temporarily caused to become electrically conductive. Then, the spacing between the oxide cathode and the grid electrode is decreased until electrical contact is established therebetween. The spacing between the oxide cathode and the grid is then increased by an amount equal to the predetermined distance.

DETAILED DESCRIPTION

Figure 1:
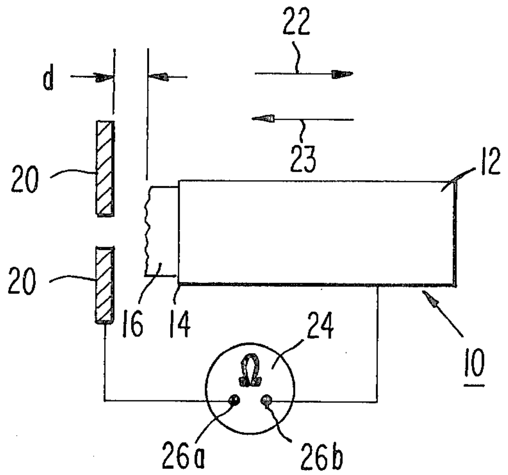
FIG. 1 is a partial sectional view of a grid and a cathode having an ohmmeter connected therebetween for practicing the method of the present invention.

Referring to FIG. 1 there is shown a cathode generally referred to as 10. The cathode 10 comprises an electrically conductive cylinder 12 which is closed at one end 14. The closed end 14 of the cylinder 12 has a layer 16 of an electron emissive carbonate material thereon. The cathode 10 is slideably mounted with respect to a G1 grid 20 (partially shown) by means of other components of an electron gun assembly (not shown). Consequently, the spacing *d* between the cathode 10 and the G1 grid 20 can be increased or decreased by moving the grid 20 with respect to a stationary cathode 10 or by moving the cathode 10 with respect to a stationary grid 20 in the directions indicated by arrows 22 and 23. An ohmmeter 24 having a pair of measurement terminals 26*a* and 26*b*, is electrically connected between the G1 grid 20 and the cathode cylinder 12.

In order to practice the method of the present invention, it is necessary that the electron emissive layer 16 be electrically conductive, at least during the time period required to set the spacing *d* between the cathode 10 and the G1 grid 20 in accordance with the steps of this method. The electron emissive layer 16 typically comprises a triple carbonate material as described on pages 96 through 98 of "Handbook of Electron Tubes and Vacuum Techniques" by Fred Rosebury, Addison-Wesley Publishing Company, Reading, Mass., 1965. Normally, this carbonate material is non-conductive; however, when the carbonate layer is moistened, for example with demineralized or distilled water, ions are formed which cause the layer to become electrically conductive. The use of demineralized or distilled water is preferred because neither will cause lingering deleterious effects which degrade cathode performance and the carbonate layer, upon drying, will return to its normal non-conductive state.

Basically, the method of the present invention comprises the following steps. First, the electron emissive layer 16 of the cathode 10 is moistened with demineralized water causing the layer 16 to become electrically conductive as previously explained. Next, the cathode to grid spacing *d* is decreased by moving the grid 20 toward the stationary cathode 10 in the direction indicated by the arrow 22 until the ohmmeter 24 indicates that electrical contact has been made therebetween. The cathode to grid spacing $d$ is then increased by withdrawing the grid 20 from the cathode 10 in the direction indicated by the arrow 23 by an amount equal to a predetermined grid to cathode spacing $d_{KG1}$. Next, the cathode 10 is permanently attached to the electron gun assembly (not shown) in fixed space relation to the G1 grid 20 at the predetermined grid to cathode spacing $d_{KG1}$. Finally, the moisture in the carbonate layer 16 of the cathode 10 is removed, for example, by heating in a dry atmosphere.

Figure 2:
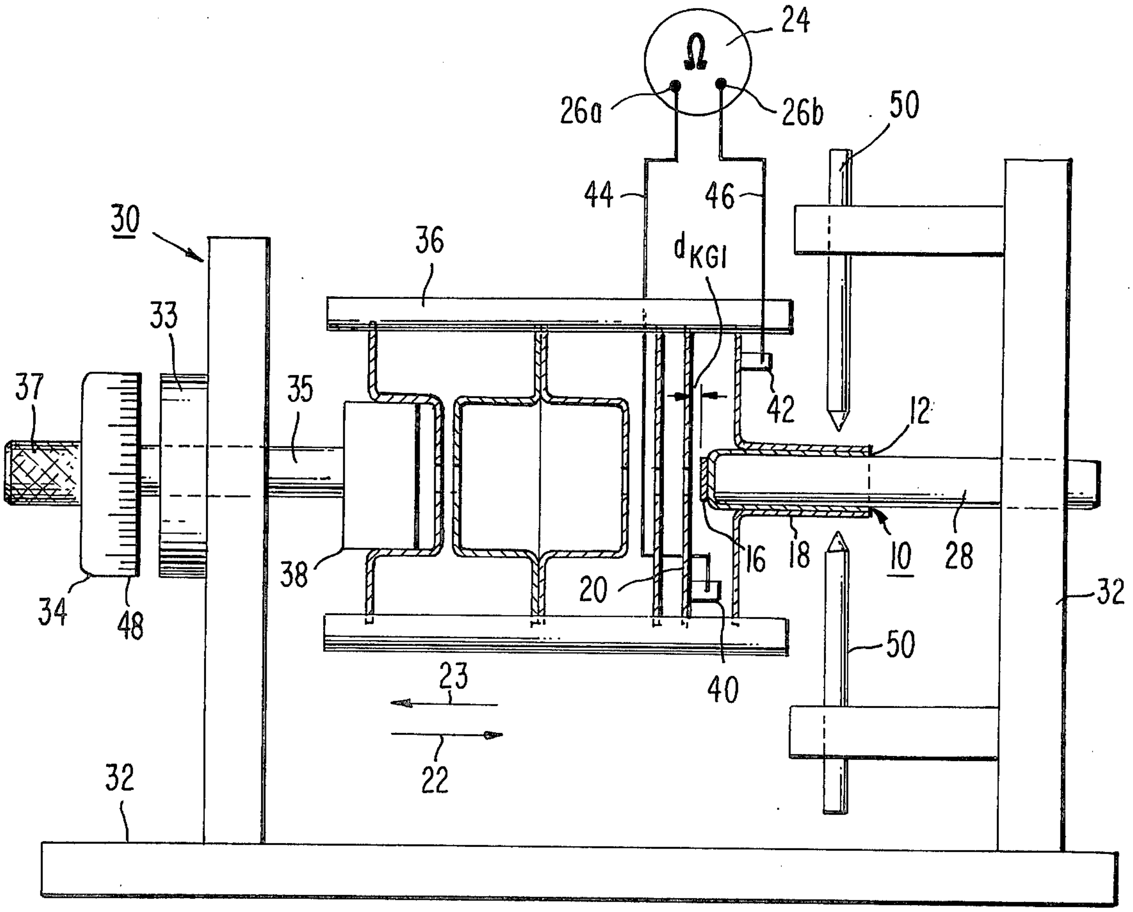
FIG. 2 is a partially sectioned elevational view of a cathode insertion apparatus used to practice the method of the present invention.

In FIG. 2 there is shown the preferred embodiment of a cathode inserting apparatus, generally referred to as 30 which is used to practice the method of the present invention. The cathode inserting apparatus 30 comprises a frame 32 for positioning a cathode 10 in a fixed spaced relation to a fixed member 33 of an adjusting micrometer 34. An electron gun assembly 36, minus the cathode 10, is positioned on a gun support mandrel 38 which is connected to a moveable member 35 of the adjusting micrometer 34. Rotating a knob 37 of the adjusting micrometer 34 causes the moveable member 35 to move in a first direction or a second direction as indicated by the arrow 22 and 23 respectively.

The electron emissive layer 16 of a cathode 10 is moistened with demineralized water then positioned on a cathode support mandrel 28 which is rigidly attached to the frame 32. The measurement terminals 26*a* and 26*b* of the ohmmeter 24 are electrically connected to a pair of tabs 40 and 42 on the electron gun assembly 36 by means of electrical conductors 44 and 46 respectively. The first tab 40 is electrically connected to the G1 grid 20. The other tab 42 is electrically connected to an electrically conductive cathode support eyelet 18 which is rigidly mounted in the electron gun assembly 36 in fixed spaced relation to the G1 grid 20.

Using the adjusting micrometer 34, the gun assembly 36 is moved toward the stationary cathode 10 in the first direction 22 causing the cathode support eyelet 18 to slideably envelop the cathode 10. The cathode 10 fits snugly within the electrically conductive cathode support eyelet 18; consequently, electrical contact is maintained therebetween. Movement of the gun assembly 36 in the first direction 22 is continued until the G1 grid 20 makes electrical contact with the electron emissive layer 16 of the cathode 10 as indicated by a change in the ohmmeter indication from the reading of high resistance to one of lower resistance. Typically, when the ohmmeter 24 is set to read on the megohm scale, the reading changes from approximately 1000 megohms (substantially full scale) before electrical contact is made to a reading of less than 1 megohm after contact is made.

A reference position reading is obtained from a position indicator 48 on the adjusting micrometer 34 at the point at which electrical contact was indicated. The gun assembly 36 is then withdrawn from the cathode 10 in the second direction 23 until the position indicator 48 indicates a position which is equal to the algebraic sum of the reference position reading and a predetermined spacing $d_{KG1}$, where $d_{KG1}$ is equal to for example 127 microns. The cathode cylinder 12 is then spot welded to the cathode support eyelet 18 by a set of retractable welding electrodes 50. This set typically comprises three welding electrodes, although only two are shown in FIG. 2 for clarity. Note that although the preferred embodiment of the method of the present invention discloses moving a gun assembly with respect to spacially fixed cathodes, the method may also be practiced by moving the cathodes with respect to a spacially fixed gun assembly and this variation is to be considered within the scope and contemplation of the invention herein disclosed.

The paramount advantage of the method of the present invention lies in its relative simplicity. Instead of requiring complex and expensive air gauges, capacitance bridges and the like, the method of the present invention can be practiced using a simple micropositioning device, for adjusting and measuring the spacing between the cathode and G1 grid, and an ohmmeter. Of course, the method of the present invention also lends itself to being practiced using more complex apparatus, such as a servo device, for advancing the G1 grid toward the cathode, which uses the ohmmeter in its feedback loop. A device of this type would enable the method of the present invention to be practiced with a minimum of human intervention.

I claim:

1. A method of manufacturing a television tube electron gun assembly including at least one oxide cathode and a G1 grid wherein said G1 grid is assembled into a unitary structure and said cathode is subsequently inserted to a predetermined spacing relative to said G1 grid, said spacing being determined with the aid of a position adjusting micrometer and an electrical continuity indicator having a pair of measurement terminals, said method comprising the steps of:

a. moistening said oxide cathode with water thereby causing said oxide cathode to become electrically conductive;
b. removeably mounting said cathode on fixed cathode support means;
c. removeably mounting said unitary structure on said position adjusting micrometer for adjusting and measuring the position of said G1 grid;
d. connecting one of said measurement terminals of said electrical continuity indicator to said cathode and the other measurement terminal to said G1 grid;
e. advancing said G1 grid toward said fixed cathode until said continuity indicator indicates electrical continuity between said cathode and said G1 grid;
f. measuring the position of the G1 grid when electrical continuity is obtained;
g. withdrawing said G1 grid from said cathode to a measured position which is equal to the algebraic sum of the predetermined spacing and the measured position at which electrical continuity was obtained;
h. permanently fixing the cathode at said predetermined spacing with respect to said G1 grid; and
i. removing the moisture from said cathode thereby causing said cathode to return to its non-conductive state.

2. A method of spacing an oxide cathode a predetermined distance from a grid electrode in a cathode ray tube electron gun assembly comprising the steps of:

a. temporarily causing said oxide cathode to become electrically conductive;
b. bringing said oxide cathode and said grid electrode into electrical contact; then
c. separating said oxide cathode and said grid electrode by an amount equal to said predetermined distance; and d. permanently fixing the cathode at said predetermined distance from said grid electrode.

3. A method in accordance with claim 2 wherein step (a) comprises moistening said oxide cathode with water.

4. A method in accordance with claim 3 wherein step (b) comprises:

i. mounting said cathode on fixed support means;

ii. mounting said grid electrode on means for adjusting and measuring the position of said grid electrode with respect to said fixed cathode;

iii. connecting electrical continuity measuring means between said cathode and said grid electrode; and iv. advancing said grid electrode toward said cathode until said electrical continuity measuring means indicates electrical continuity therebetween.

* * * * *